(12) United States Patent
Teoh

(10) Patent No.: US 9,366,721 B2
(45) Date of Patent: Jun. 14, 2016

(54) APPARATUS FOR BURN-IN TEST

(71) Applicant: Pentamaster Instrumentation SDN BHD, Penang (MY)

(72) Inventor: Siow Khiang Teoh, Bayan Lepas (MY)

(73) Assignee: Pentamaster Instrumentation SDN BHD, Penang (MY)

(*) Notice: Subject to any disclaimer, the term of this patent is extended or adjusted under 35 U.S.C. 154(b) by 52 days.

(21) Appl. No.: 14/532,461

(22) Filed: Nov. 4, 2014

(65) Prior Publication Data

US 2016/0091559 A1 Mar. 31, 2016

(30) Foreign Application Priority Data

Sep. 25, 2014 (MY) .......................... PI 2014702797

(51) Int. Cl.
| | | |
|---|---|---|
| *G01R 31/10* | (2006.01) | |
| *G01R 31/28* | (2006.01) | |
| *G01R 1/44* | (2006.01) | |
| *G01R 1/04* | (2006.01) | |

(52) U.S. Cl.
CPC .......... *G01R 31/2875* (2013.01); *G01R 1/0425* (2013.01); *G01R 1/44* (2013.01); *G01R 31/2862* (2013.01); *G01R 31/2867* (2013.01); *G01R 31/2877* (2013.01)

(58) Field of Classification Search
CPC ........... G01R 31/2874; G01R 31/2863; G01R 31/275; G01R 31/2872; G01R 31/2884; G01R 31/31905; G01R 31/2849
See application file for complete search history.

(56) References Cited

U.S. PATENT DOCUMENTS

| | | | | |
|---|---|---|---|---|
| 5,103,168 | A * | 4/1992 | Fuoco ................ | G01R 31/2817 324/73.1 |
| 5,297,621 | A * | 3/1994 | Taraci ................ | G01R 31/2891 165/104.13 |
| 5,579,826 | A | 12/1996 | Hamilton et al. | |
| 6,857,283 | B2 | 2/2005 | Tilton et al. | |
| 8,274,300 | B2 | 9/2012 | Sakaue et al. | |
| 2005/0067146 | A1 | 3/2005 | Thayer et al. | |

* cited by examiner

*Primary Examiner* — Tung X Nguyen
(74) *Attorney, Agent, or Firm* — Suzannah K. Sundby, Esq.; Canady + Lortz LLP

(57) ABSTRACT

The present invention relates to an apparatus for burn-in of a device under test (4), characterized by: a thermal conductive plate (2) including a cooling channel (3) for allowing passage of a cooling medium for regulating temperature of the thermal conductive plate (2); the device under test (4) placed on the thermal conductive plate (2); a pressure chamber (5) engaged to the device under test (4), comprising a hollow housing (6) including an integrated cooling passage (7), an air inlet (8), a seal (9) and air outlet (10) aid in regulating temperature of said pressure chamber; and a pin guide means comprising an upper guide (11) embedded in the thermal conductive plate (2) and a lower guide (12) for guiding movement of the pogo pin (13) and its connection with the device under test (4).

23 Claims, 11 Drawing Sheets

US 9,366,721 B2

APPARATUS FOR BURN-IN TEST

BACKGROUND OF THE INVENTION

1. Field of the Invention

This invention relates to a burn-in test device, more particularly to an apparatus for carrying out burn-in test of a device under test including semiconductors and light emitting diode (LED) arrays.

2. Description of Related Arts

Electronic device such as semiconductors and light emitting diodes (LED) are often subjected to burn-in test to determine stress strength, operating lifespan and defectiveness of said electronic device. The burn-in test machine simulates various environmental conditions during the test. The device under test that presents in array form is easier to be handled than in singular unit. In array form, the quantity of the device under test is large ranging from a few hundreds to a few thousands.

The contemporary bright LEDs and high speed semiconductors are often small in size and driven by high electrical power. When combining these devices in large amount in array form, substantially high electrical power consumption (from a few hundred watts to a few kilowatts or more) is required in order to provide constant electrical current to said device during the burn-in test. This has created a huge challenge in thermal management involving cooling down the temperature of the device under test and regulating predefined sets of environmental conditions during the burn-in test.

Various attempts in configuring the thermal management system for burn-in test have been disclosed in the prior arts. The U.S. Pat. No. 5,579,826 disclosed a thermal control system to be utilized in a burn-in system for semiconductors, which generally comprises a thermocouple, liquid reservoir, liquid, pump, spray array and a controller for controlling flow of the thermal and cooling elements to the spray array. Said liquid will be sprayed on the semiconductor to regulate the temperature and reused.

Another example of thermal management system for burn-in of semiconductors has been disclosed in U.S. Pat. No. 6,857,283 B2. Said system is a closed loop spray cooling system, which has two spray portions and one of them is extendable to reduce distance between the test object surface and the thermal management system to cool the heated temperature.

U.S. Publication No. 2005/0067146 A1 presents an apparatus functioning as a cooling system for burn-in of a semiconductor device. The cooling system uses evaporator containing a capillary wick to draw a coolant liquid from a pool which in turn cools the semiconductor. A condenser arranged in fluid communication with the evaporator.

A thermal control unit which dissipate heat with the use of a heat pipe is disclosed in U.S. Pat. No. 8,274,300 B2. Another known prior art which may be pertinent is Shimada T. et al., "Developing temperature control technology: Utilizing a mist-cooling system for devices that generate high temperature", Journal of Espec Technology Report No. 19. A mist cooling system is utilised in said journal to cool down the temperature of the electronic device.

There are some drawbacks and limitations of the apparatuses disclosed in the prior arts as their construction and operation unable to provide an effective thermal and cold temperature regulation during the burn-in test as above-mentioned. Therefore, there is a need to provide an improved apparatus for burn-in test, which could overcome the aforementioned shortcomings.

SUMMARY OF INVENTION

It is an objective of the present invention to provide an apparatus for burn-in testing of a device under test, which comprises a thermal conductive plate including a heating and cooling regulation design.

It is also an objective of the present invention to provide an apparatus for burn-in testing of the device under test, which comprises a pressure chamber mechanism for holding down the device under test against the thermal conductive plate in a non-contact manner.

It is yet another objective of the present invention to provide an apparatus for burn-in testing of the device under test, which includes a pin guide means for holding pogo pin which effectively transmits electrical current to the device under test, aiding in heat generation and the cooling regulation.

It is a further objective of the present invention to provide an apparatus for burn-in testing of the device under test, which has enhanced performance on heating and cooling regulation and able to provide an effective burn-in test for semiconductor and light emitting diode (LED) arrays.

Accordingly, these objectives may be achieved by following the teachings of the present invention. The present invention relates to a an apparatus for burn-in of a device under test, characterized by: a thermal conductive plate including a cooling channel for allowing passage of a cooling medium for regulating temperature of the thermal conductive plate; the device under test is placed on the thermal conductive plate; a pressure chamber engaged to the device under test, comprising a hollow housing including a cooling passage for allowing flow of the cooling medium to regulate temperature of said pressure chamber, an air inlet for receiving compressed air to exert uniform pressure on a surface of the device under test to press said device under test against the thermal conductive plate, a seal sealing the hollow housing over the device under test for retaining the compressed air within said housing, and an air outlet for releasing the compressed air from said housing; and a pin guide means including an upper guide embedded in the thermal conductive plate for holding a pogo pin, and a lower guide positioned below the thermal conductive plate for coupling the pogo pin and contacting said pogo pin with the device under test; and wherein said pogo pin is connected with an electrical current supply for supplying electrical current to the device under test.

BRIEF DESCRIPTION OF THE DRAWINGS

The features of the invention will be more readily understood and appreciated from the following detailed description when read in conjunction with the accompanying drawings of the preferred embodiment of the present invention, in which:

FIG. 5 is a cross-sectional view of a pressure chamber of said apparatus for burn-in.

DETAILED DESCRIPTION OF THE INVENTION

Figure 1:
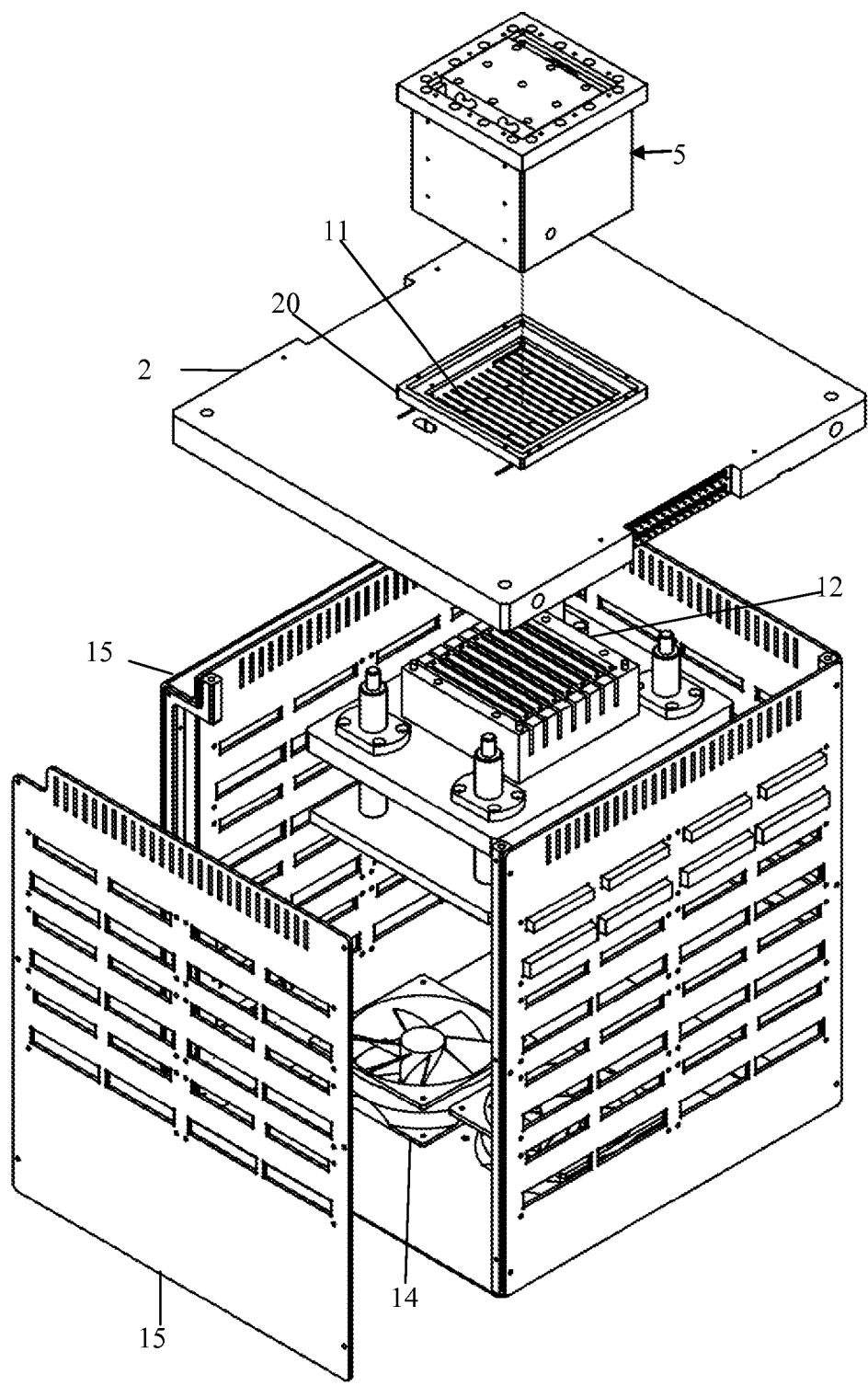
FIG. 1 is an exploded view of an apparatus for burn-in of a device under test.
Figure 2:
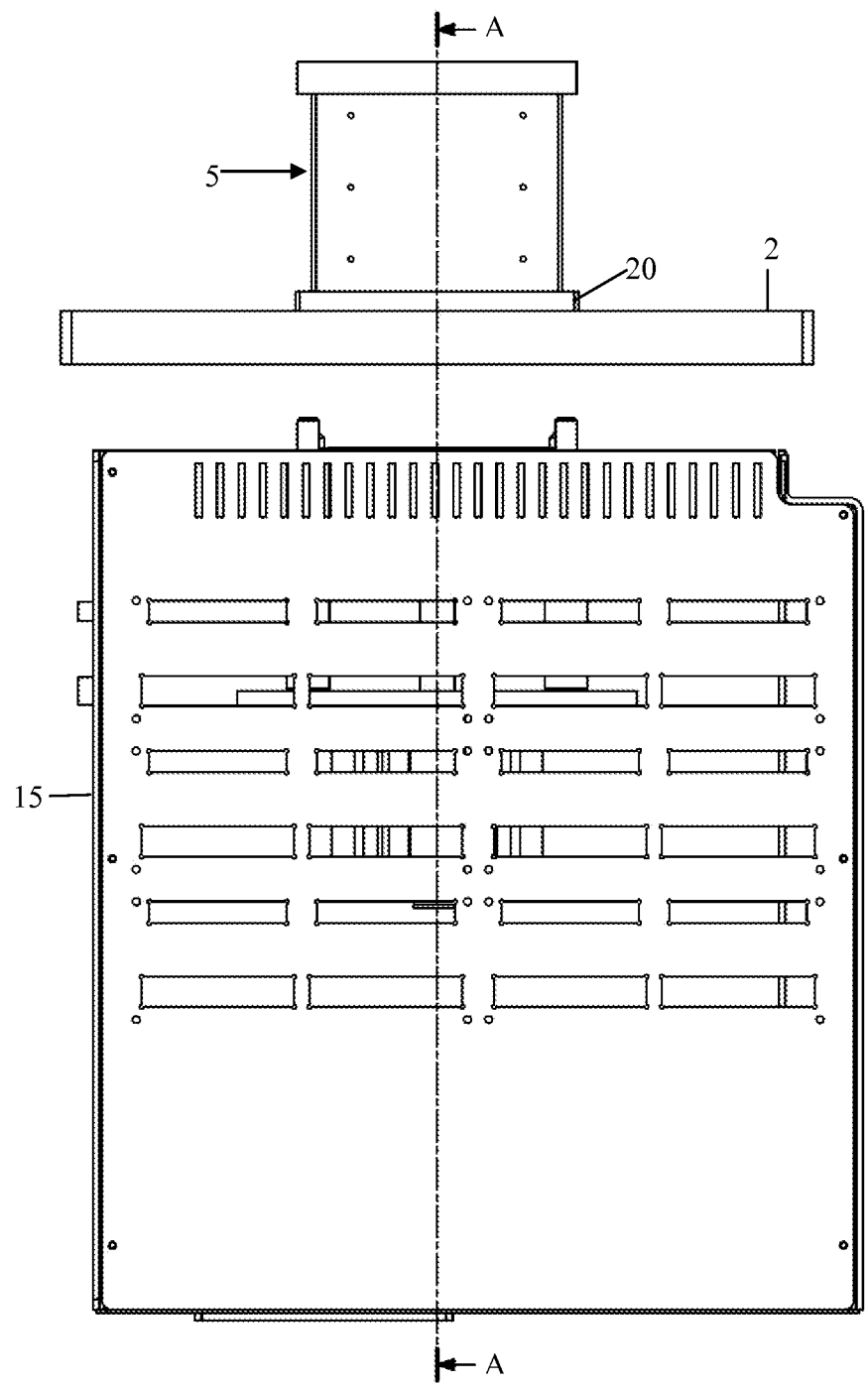
FIG. 2 is a side view of the apparatus for burn-in of the device under test.

As required, detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting but merely as a basis for claims. It should be understood that the drawings and detailed description thereto are not intended to limit the invention to the particular form disclosed, but on the contrary, the invention is to cover all modification, equivalents and alternatives falling within the scope of the present invention as defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to. Further, the words "a" or "an" mean "at least one" and the word "plurality" means one or more, unless otherwise mentioned. Where the abbreviations or technical terms are used, these indicate the commonly accepted meanings as known in the technical field. For ease of reference, common reference numerals will be used throughout the figures when referring to the same or similar features common to the figures. The present invention will now be described with reference to FIGS. 1-21.

The present invention presents an apparatus utilised for performing burn-in testing of a device under test (4), hereinafter referred to as a burn-in test apparatus. Said apparatus comprises: a thermal conductive plate (2); a device under test (4); a pressure chamber (5); a pin guide means; a processor operatively connected with said thermal conductive plate (2), the pressure chamber (5) and the pin guide means; and characterized by: the thermal conductive plate (2) including a cooling channel (3) for allowing passage of a cooling medium for regulating temperature of the thermal conductive plate (2); the device under test (4) is placed on the thermal conductive plate (2); the pressure chamber (5) engaged to the device under test (4), comprising a hollow housing (6) including a top close-end, a bottom open-end and a cooling passage (7) integrated in a wall of said hollow housing (6) for allowing flow of the cooling medium to regulate temperature of said hollow housing (6); an air inlet (8) connected to an air supply for delivering compressed air into the hollow housing (6) to create a pressure within said hollow housing (6), wherein said pressure is uniformly exerted on a surface of the device under test (4) to press said device under test (4) against the thermal conductive plate (2), a seal (9) coupled to a periphery of the bottom open-end of the hollow housing (6) for sealing said hollow housing (6) over the device under test (4) to retain the compressed air within said housing (6), and an air outlet (10) for releasing the compressed air from said housing (6); and a pin guide means comprising an upper guide (11) having a plurality of guide holes, embedded in the thermal conductive plate (2), a plurality of pogo pins loaded into the guide holes of the upper guide (11) and electrically connected to an electrical current supply; and a lower guide (12) having a plurality of guide holes (47), positioned parallel to and below the upper guide (11) for engaging with the upper guide (11) and elevating the pogo pins (13), therebybringing said pogo pins (13) into contact with the device under test (4).

In a preferred embodiment of said apparatus, the device under test (4) comprises a semiconductor, a light emitting diode (LED), a semiconductor array, a light emitting diode (LED) array or a combination thereof.

In a preferred embodiment of said apparatus, said apparatus further comprises a said apparatus further comprises a fan (14) affixed below the lower guide (12) for circulating cold air to achieve a uniform temperature.

In a preferred embodiment of said apparatus, said apparatus further comprises an enclosure (15) for covering periphery of the lower guide (12). With the employment of the enclosure (15), the fan (14) is preferably affixed at a bottom of the enclosure (15) beneath the lower guide (12), for circulating cold air within said enclosure (15) to achieve the uniform temperature.

In a preferred embodiment of said apparatus, said apparatus further comprises an actuator (44) coupled to the lower guide (12) for controlling movement of the lower guide (12).

In a preferred embodiment of said apparatus, the thermal conductive plate (2) is made from stainless steel, copper, aluminium, a thermal matching medium (18) or a combination thereof.

In a preferred embodiment of said apparatus, the thermal conductive plate (2) includes the thermal matching medium (18) for matching the temperature of said thermal conductive plate (2) to an operating temperature of the cooling medium.

In a preferred embodiment of said apparatus, the thermal conductive plate (2) includes a plurality of slots (38) on a surface (preferably a top surface) of said plate (2) for effectively isolating multiple temperature control zones (37).

In a preferred embodiment of said apparatus, the cooling channel (3) is connected to a dual reservoir chiller (19) for supplying the cooling medium.

In a preferred embodiment of said apparatus, the cooling channel (3) comprises a copper coil.

In a preferred embodiment of said apparatus, the thermal conductive plate (2) includes a heater (16) for providing heat to the thermal conductive plate (2) for temperature control.

In a preferred embodiment of said apparatus, the heater (16) includes a moisture barrier (17) for preventing moisture intrusion.

In a preferred embodiment of said apparatus, the heater (16) is bent downwards for preventing moisture seepage during heating.

In a preferred embodiment of said apparatus, the heater (16) is controlled by the processor (32) for providing a secondary temperature control by adding heat to the thermal conductive plate in a systematic controlled manner to regulate temperature of the thermal conductive plate (2), after the cooling medium temperature and flow rate are set for cooling the temperature at substantially below a set point temperature.

In a preferred embodiment of said apparatus, the processor (32) is preferably a proportional integral derivative (PID) controller.

In a preferred embodiment of said apparatus, said apparatus further comprises a nested plate (20) on the thermal conductive plate (2) for receiving the pressure chamber (5).

In a preferred embodiment of said apparatus, said pogo pin (13) is connected to an electrical current supply via a wiring means such as a wire jack (21) or any other electrical connecting means, to replace a conventional load board.

In a preferred embodiment of said apparatus, a temperature valve (34) is placed at the channel outlet (31) of the cooling channel (3) for ensuring the cooling medium completely fills the cooling channel (3).

In a preferred embodiment of said apparatus, the air inlet (8) is connected to a compressed air supply via a pneumatic fitting.

In a preferred embodiment of said apparatus, said apparatus further comprises a locking means (22) for locking the pressure chamber (5) in place.

In a preferred embodiment of said apparatus, the pressure within the hollow housing (6) is uniformly exerted on the surface of the device under test (4) to press said device under test (4) against the thermal conductive plate (2) in a non-contact manner.

In a preferred embodiment of said apparatus, the pressure chamber (5) further comprises a pressure valve (48) for releasing hot air from interior of the hollow housing and aiding in cooling down temperature and pressure of the pressure chamber (5).

In a preferred embodiment of said apparatus, the device under test (4) is connected to a multi-channel, floating ground constant current driver for eliminating current crowding to the device under test (4).

In a preferred embodiment of said apparatus, the upper guide (11) and the lower guide (12) are each independently made from ceramic material or engineering plastic material to prevent operation failure at an elevated temperature.

In a preferred embodiment of said apparatus, said apparatus further comprises an air nozzle (23), preferably a multi-stream air nozzle, for regulating and cooling the surface temperature of the device under test (4).

In a preferred embodiment of said apparatus, said apparatus further comprises a clamping means (25) comprising a clamp holder (26) for holding a spring (27); and a cover plate (28) positioned above the spring (27) for pressing on said spring (27), thereby contacting the clamp holder (26) with the device under test (4).

Figure 4:
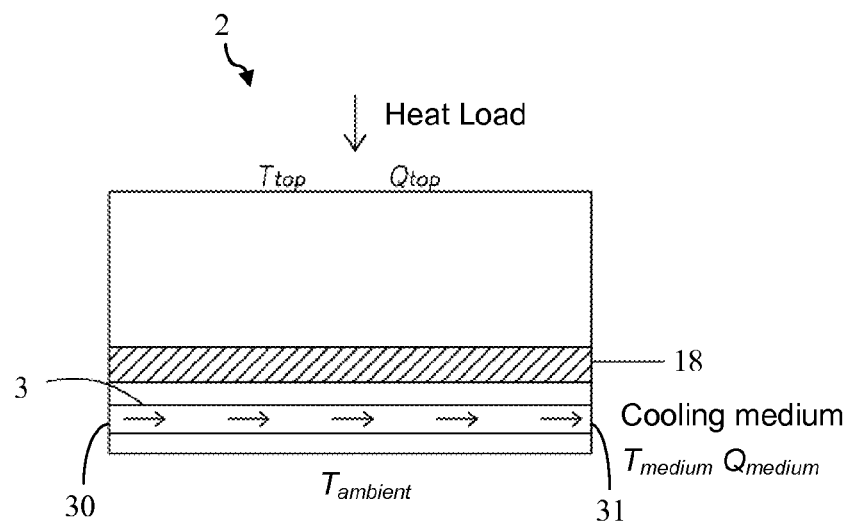
FIG. 4 is a cross-sectional view of a thermal conductive plate.
Figure 5:
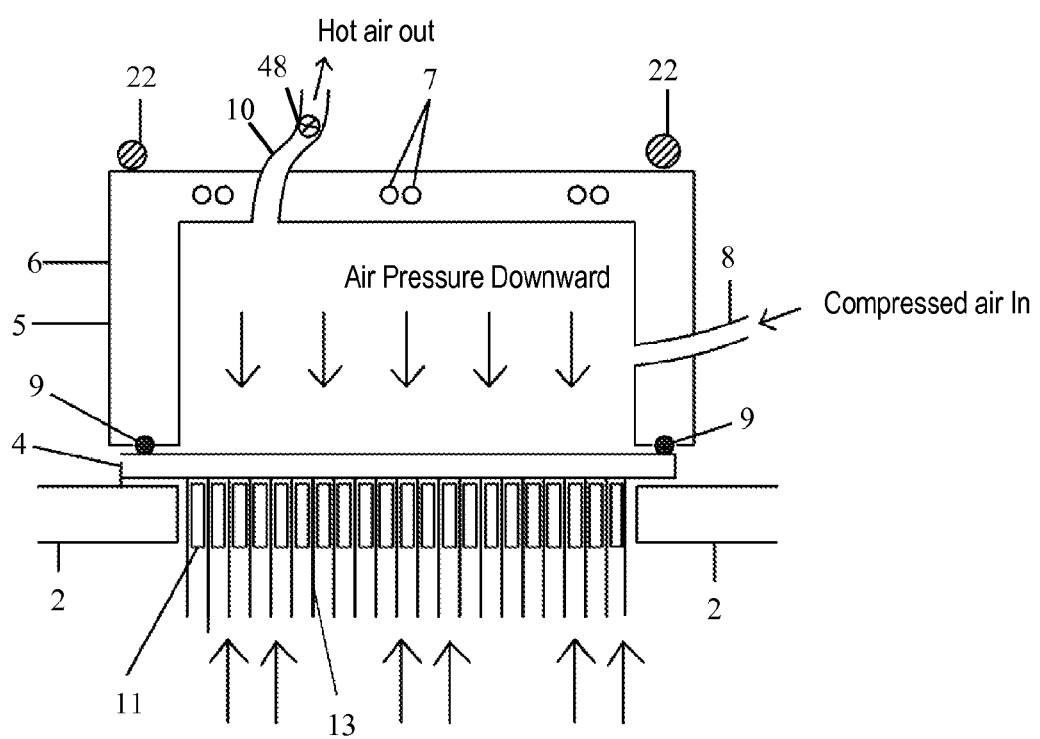

With reference to FIG. 1, said burn-in test apparatus generally comprises the thermal conductive plate (2), the pressure chamber (5), the pin guide means and the fan (14). Said thermal conductive plate (2) includes the cooling channel (3) for allowing passage of the cooling medium, the heater (16) and/or a thermocouple. The cooling medium used in the present invention is an isothermal liquid, preferably water or a thermal oil. The water, preferably chill water, is the preferred choice for the cooling medium, however said chill water has a limited working temperature range compare to the working temperature range of the thermal oil. In order to solve this problem, the thermal conductive plate (2) of the preferred embodiment of the present invention is configured to include the thermal matching medium (18) to match the temperature of said thermal conductive plate (2) to an operating temperature of the cooling medium, particularly operating temperature of the water. As shown in FIG. 4, the thermal matching medium (18), particularly a layer of the thermal matching medium (18), is positioned in the thermal conductive plate (2), above the cooling channel (3). More preferably, the thermal matching medium (18) is sandwiched between two layers of the thermal conductive plate (2).

Referring to FIG. 4 and assuming no heat loss to the environment ($Q_{medium}=Q_{top}$), the cooling medium temperature ($T_{medium}$) will be obtained from Equation 1:

$$T_{medium} \approx T_{top} - T_{match} \quad (1)$$

wherein, $Q_{medium}$ represents quantum heat of the cooling medium.

$Q_{top}$ represents quantum heat of the top surface of the thermal conductive plate (2).

$T_{medium}$ represents temperature of the cooling medium.

$T_{top}$ represents temperature of the top surface of the thermal conductive plate (2).

$T_{match}$ represents temperature of the thermal matching material (18).

The material used to fabricate the thermal conductive plate (2) and the thermal matching medium (18) is preferably a metal. In a preferred embodiment, the metal used to make the thermal matching medium (18) has different thermal properties from the metal used to make the thermal conductive plate (2), wherein the thermal matching medium (18) has stronger thermal properties (for example, thermal conductivity) than the thermal conductive plate (2).

Figure 6:
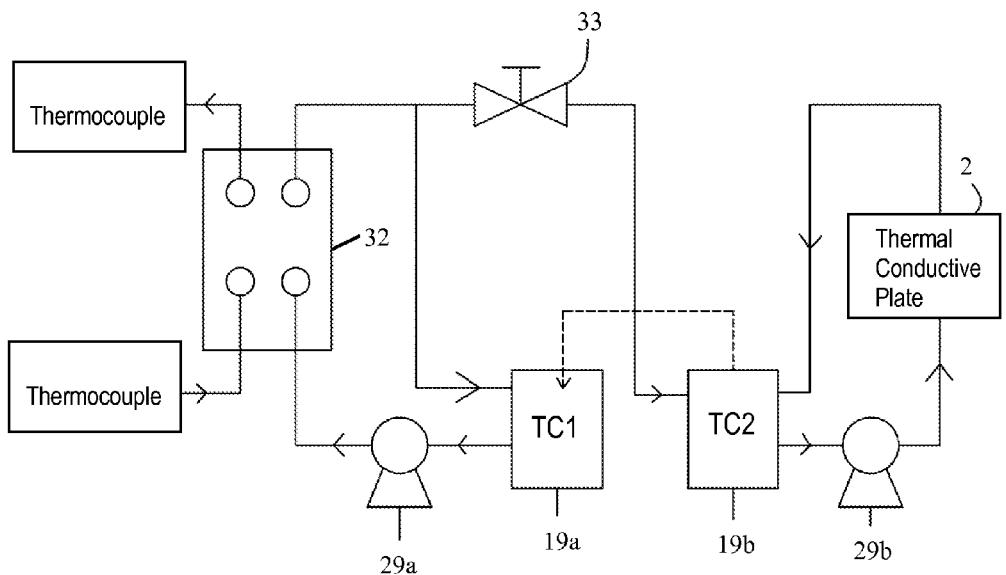
FIG. 6 is a schematic drawing showing connection of a thermal conductive plate with a dual reservoir.
Figure 7:
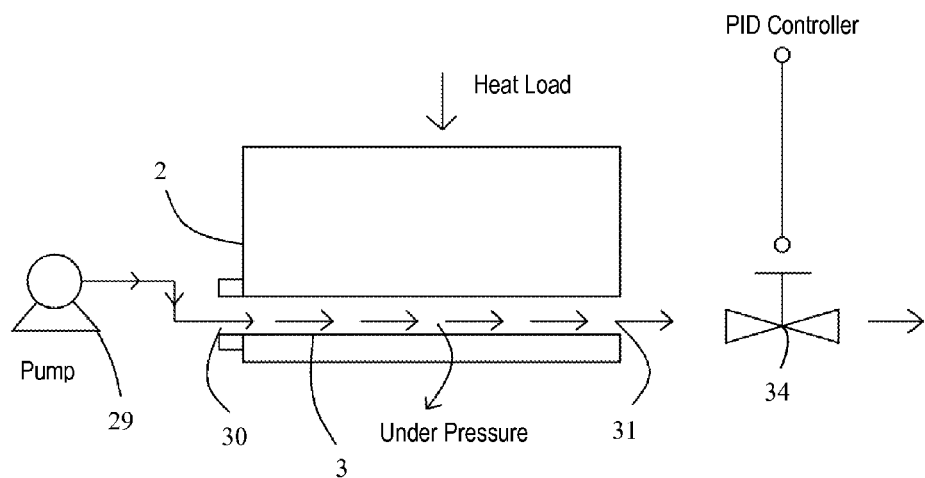
FIG. 7 is a diagram showing arrangement of a temperature valve at a channel outlet of the thermal conductive plate.

The cooling channel (3) of the thermal conductive plate (2) is connected to a dual reservoir chiller (19) via a cooling medium pump (29), wherein the cooling channel (3) receives the cooling medium from the dual reservoir chiller (19). FIG. 6 illustrates a schematic diagram of the connection between the cooling channel (3) of the thermal conductive plate (2) with the dual reservoir chiller (19) and two cooling medium pumps (29). In a preferred embodiment, the cooling channel (3) has a channel inlet (30) and a channel outlet (31). The processor (32), preferably the proportional-integral-derivative (PID) controller, is operatively connected to the heater and/or thermocouple of the thermal conductive plate (2), the pump (29) and the dual reservoir chillers (19) for automatically controlling flow rate of the cooling medium corresponds to a temperature change feedback received from the heater and/or the thermocouple.

Referring again to the FIG. 6, the dual reservoir chiller (19) includes a first reservoir (19a) and a second reservoir (19b); wherein the pump (29) includes a first pump (29a) and a second pump (29b). When the PID controller (32) receives a feedback from the heater and/or the thermocouple, a signal is transmitted to a release valve (33) for releasing the cooling medium to the second reservoir (19b) and further pumped into the cooling channel (3) of the thermal conductive plate (2) via the second pump (29b) and the channel inlet (30) for regulating temperature of the thermal conductive plate (2). The cooling medium is then circulated back to the second reservoir (19b), and be transferred from the second reservoir (19b) to the first reservoir (19a) for storage. With a command received from the PID controller (32), the cooling medium stored in the first reservoir (19a) will then recycled and flow to the second reservoir (19b) through the first pump (29a) and the release valve (33).

At a very high electrical power (preferably in a range from a few hundred watts to a few kilowatts or more) used in the burn-in test application, temperature of the cooling medium can be raised too high beyond the operating capability of a heat exchanger of the dual reservoir chiller (19). Under such circumstances, the conventional burn-in test apparatus will use one process pump to circulate the cooling medium between one reservoir chiller and the heat exchanger under normal chiller and/or heat exchanger operating temperature limit (approximately 50° C. only). Beneficially, by utilising the additional pump and additional reservoir chiller (preferably the first pump (29a) and first reservoir chiller (19a)) as disclosed in the present invention, the temperature of the cooling medium can be raised to any degree below boiling point of said cooling medium. Hence, the apparatus of the present invention can use to extend the operating temperature of the cooling medium either the water or thermal oil. Thus, water can be used in the present apparatus.

In conventional cooling medium flow control, a temperature control valve (34) is normally placed in between the pump (29) and the channel inlet (30). But, in a preferred embodiment of the present invention, the temperature control valve (34) is placed after the channel outlet (31) and operatively connected to the processor (32) to ensure the cooling channel (3) is completely filled with the cooling medium and able to detect an accurate temperature of the cooling medium, resulting the cooling medium in contact with the channel (3) surface at all time during the circulation to achieve stable heat transfer and reduce temperature fluctuation.

Figures 8A, 8B:
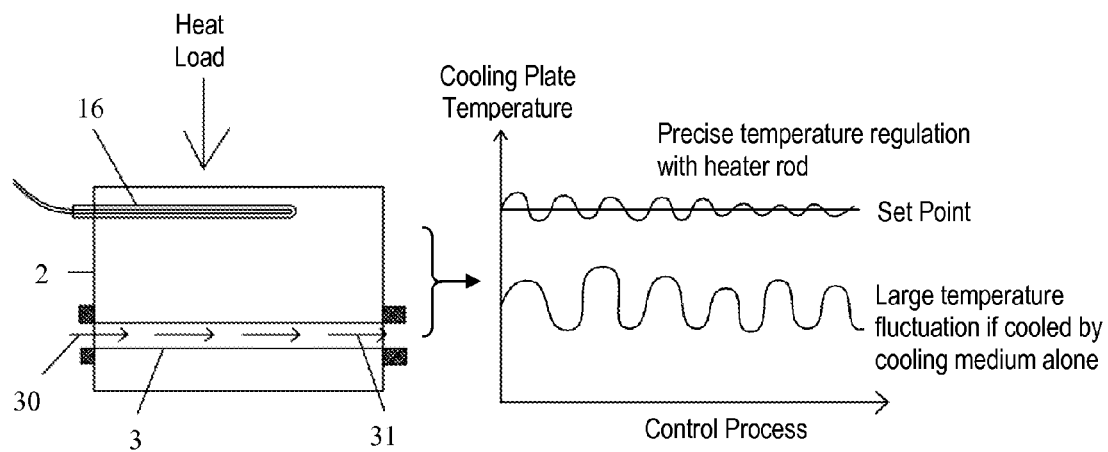
FIG. 8a is a cross-sectional view of the thermal conductive plate including a heater and a cooling channel.
FIG. 8b is a graph showing temperature of the thermal conductive plate, heater and the cooling medium during the burn-in test.
Figure 9:
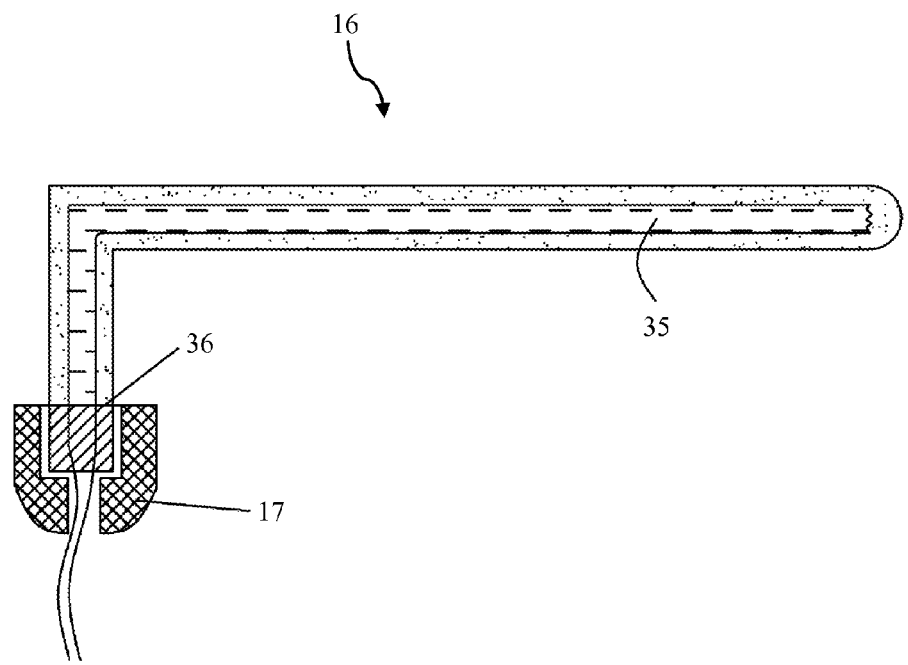
FIG. 9 is a cross-sectional view of the heater.

In a conventional cooling application, a heat sink, a thermoelectric cooler (TEC) or a cooling medium is often be used. Though the TEC regulate temperature very well, the ability to deal with vast amount of heat is cost prohibitive. In a preferred embodiment of the present invention, the chill water and thermal conductive plate (2) are used to extract heat but said heat extraction is often carried out at an irregular temperature. The heat is extracted but there is lack of control over temperature regulation. The heating and cooling is required to be achieved at fast operating rate and at precise temperature. Hence, the thermal conductive plate (2) of the preferred embodiment of the present invention includes a heater (16) mounted inside the thermal conductive plate (2), wherein said heater (16) is preferably controlled by the processor (32) for providing effective and precise temperature control or secondary temperature control. Said heater (16) is susceptible to moisture intrusion especially under high temperature and high humidity temperature. As shown in FIG. 9, the heater (16) is provided with a thermal compound (35) inside said heater (16) for absorbing moisture. But, the moisture absorbed by the thermal compound (35) inside the heater (16) will also leaks from the heater (35). To overcome said problem, the moisture barrier (17) preferably the silicone rubber serves as barrier to moisture intrusion is coupled to the heater (16). The silicone rubber is pre-baked to drive out a volatile substance (for example, an outgas). The heater (16) preferably bends downward (preferably to a 90 degree bending point) to prevent moisture seepage during heating by forcing the moisture to works against the gravity. A polytetrafluoroethylene layer (36), preferably made from Teflon®, having a preferred 5 mm width is positioned at the end of the heater (16), acting as a cool zone to further reduce condensation of the thermal compound (35) and hence the moisture intrusion. In operation, the chill water temperature and flow rate is first set to cool the temperature much below the set point as shown in FIG. 8(b). The heater (16) that connected to the processor (32) provides a secondary temperature control by adding heat in a systematic, controlled process to regulate the temperature of the thermal conductive plate (2).

Figure 10:
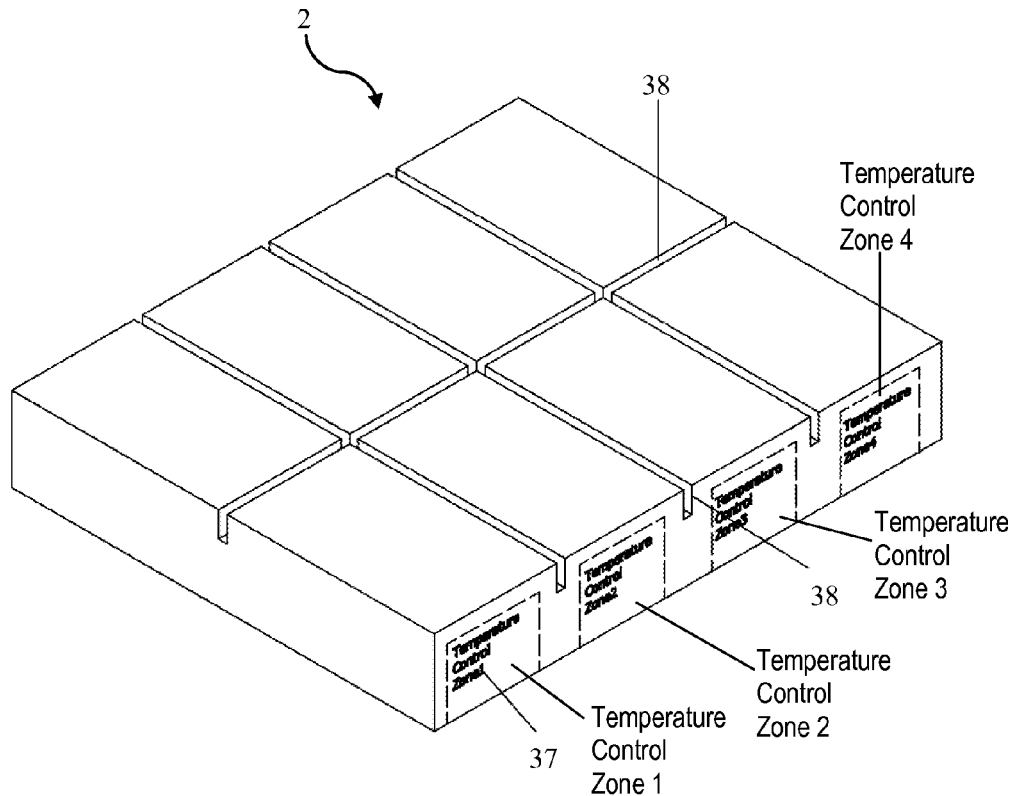
FIG. 10 is a perspective view of a thermal conductive plate according to one of the embodiments of the present invention.
Figure 11:
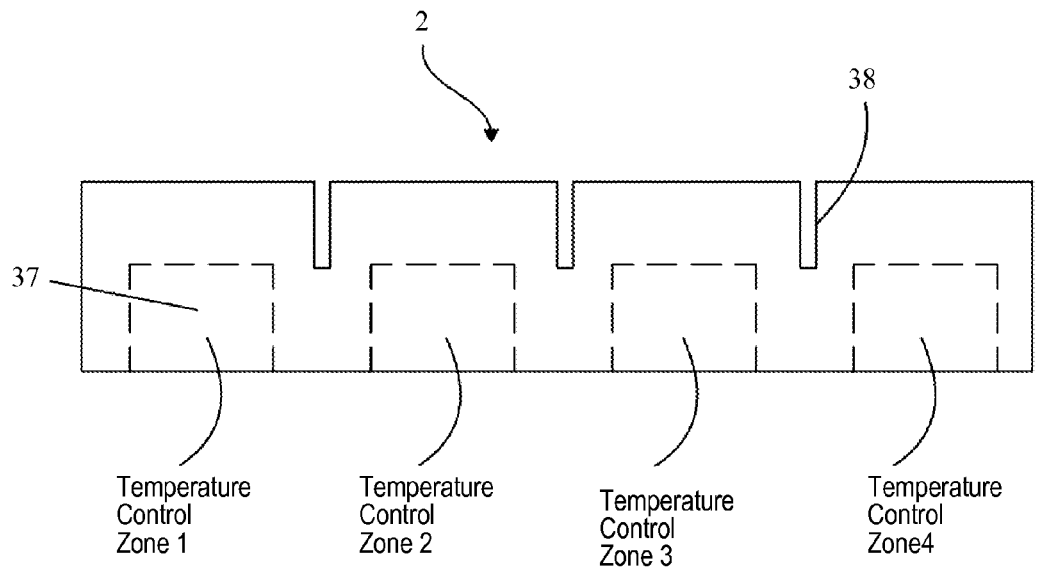
FIG. 11 is a cross-sectional view of FIG. 10.

The heat generated by the device under test (4) is often not uniform across the top surface of said device under test (4) array. In order to create a more uniform temperature across the top surface of said array, multiple zones (37) of temperature control and regulation are used to accommodate the varying heat load exerted across said top surface of the device under test (4). In a preferred embodiment, the thermal conductive plate (2) further comprises a multiple temperature control zones (37), and preferably eight temperature control zones (37) is utilised. It should be understood that the number of the temperature control zone (37) can be varied depending on the need of a user. Referring to FIG. 10 and FIG. 11, the thermal conductive plate (2) also includes a plurality of vertical and horizontal slots (38) intersecting on the surface of said thermal conductive plate (2); and the eight temperature control zones (37). The slots (38) are filled with the compressed air during operation, thereby acting as good thermal insulators for more precise temperature control. The temperature control zone (37) is used as a conduit for placing the cooling channel (3). In a preferred embodiment, said slots (38) have dimensions of 2 cm×1 mm and are cut into the top surface of the thermal conductive plate (2) to effectively isolate eight different zones (37).

For conventional thermal heat dissipation, the material such as metal including copper or aluminium are usually used to make the thermal conductive plate (2) as said material poses good thermal conductivity and mechanical strength. However, when said apparatus is placed in a humidity chamber to mimic various testing environment, the metal will corrode easily in said humidity chamber even though said metal has proper surface treatment with gold or nickel material. To prevent the galvanic corrosion, a stainless steel material, preferably stainless steel 316 is selected to make the thermal conductive plate (2) due to its excellent corrosion resistance, wear resistance and good mechanical strength. In another preferred embodiment where said apparatus is used in a non-humid environment or does not put inside the humidity chamber, the thermal conductive plate (2) is made from aluminium and the cooling channel (3) is preferably constructed by the copper coil or pipe or tube embedded in the cheaper aluminium thermal conductive plate (2).

Figure 12:
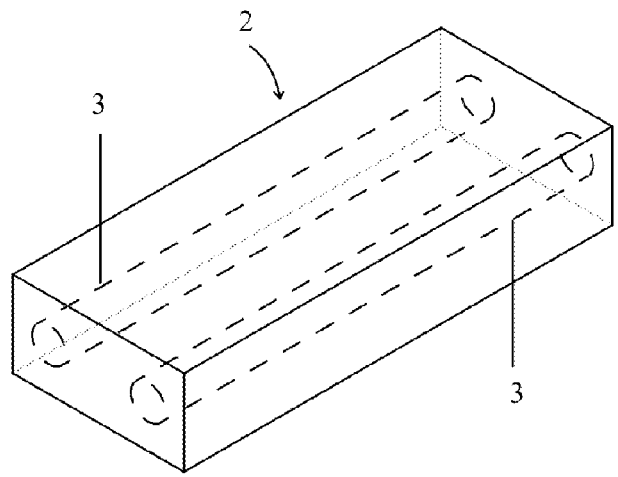
FIG. 12 is a perspective view of the thermal conductive plate with the cooling channel.
Figure 13:
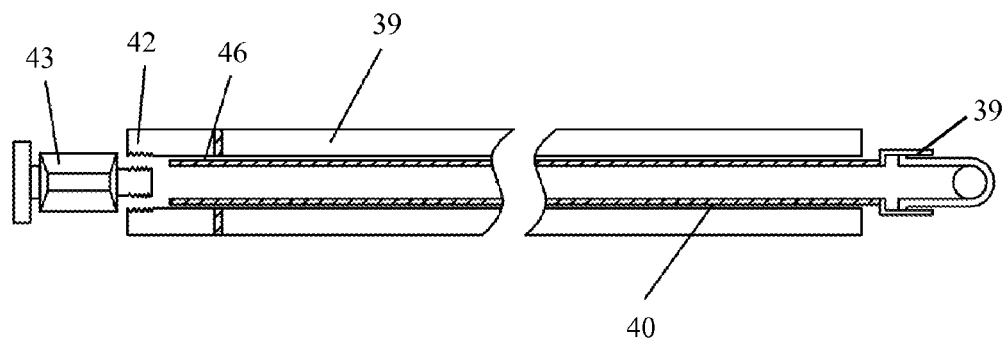
FIG. 13 is a cross-sectional view of the thermal conductive plate with the cooling channel according to one embodiment of the present invention.
Figure 14:
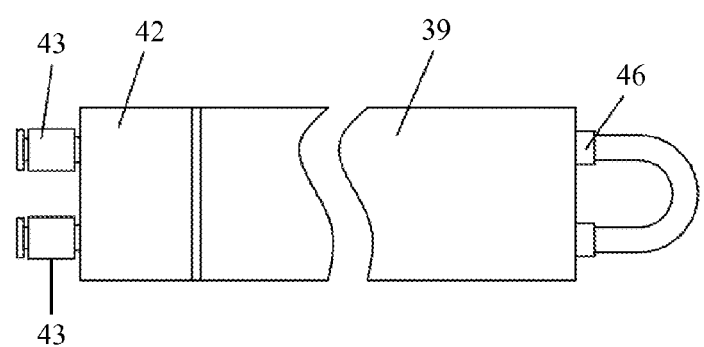
FIG. 14 is a side view of FIG. 13.
Figure 15:
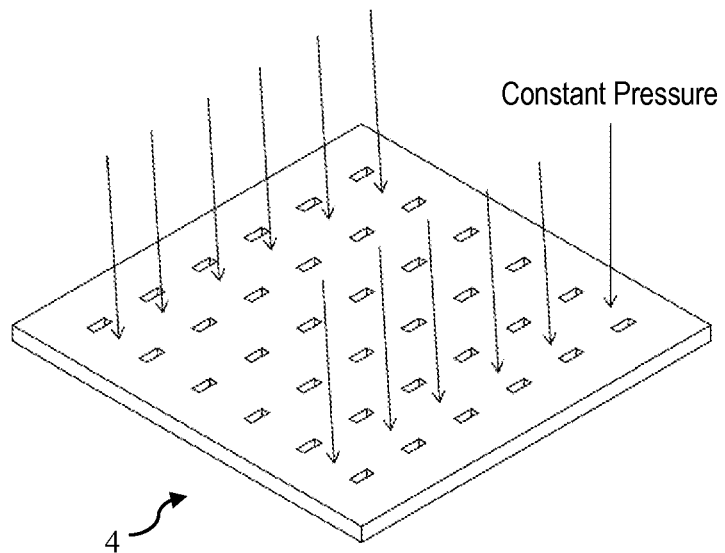
FIG. 15 is a perspective view of the device under test.

FIG. 12 depicts the thermal conductive plate (2) and the cooling channel (3). FIG. 13 and FIG. 14 show different views of the second embodiment of the thermal conductive plate (2) and the cooling channel (3). Referring to FIG. 13, the thermal conductive plate (2) comprises a body (39) coupled to a tube fitting (43) at one end of the body (39); a tube (40) having a general U-shaped, positioned inside said body (39) and coupled to the tube fitting (43) via a bracket (42), wherein the tube (40) is referred to the cooling channel (3). Said body (39) is preferably made from aluminium; said tube (40) and said bracket (42) are each preferably made from copper. Said tube (40) also comprises a braze joint (46). Said second embodiment of the thermal conductive plate (2) may be used in a non-humid chamber.

Turning back to FIG. 5, the pressure chamber (5) of the present apparatus comprises the hollow housing (6) including the top closed-end, the bottom open-end, and the cooling passage (7) integrated to the wall of said hollow housing (6) for allowing the flow of the cooling medium for cooling down the temperature of the pressure chamber (5). The air inlet (8) and air outlet (10) pass through said hollow housing (6), wherein both the air inlet (8) and the air outlet (10) are connected to an external air supply. The air inlet (8) is preferably connected to a compressed air supply, and wherein the air outlet (10) is preferably connected to a pressure gauge. The seal (9), preferably a silicone vacuum seal is coupled to the periphery of the bottom open-end of the hollow housing (6) for air-tight sealing said hollow housing (6) over the device under test (4) for retaining the compressed air within said hollow housing (6) or preventing air leakage.

When the compressed air supply is actuated, the pressure chamber (5) moves downward towards the thermal conductive plate (2) and secure therewith by the locking means (22). The compressed air is released into interior of the hollow housing (6) and the seal (9) seals the hollow housing (6) tightly over the device under test (4). As the compressed air is being pumped in, interior pressure of the hollow housing (6) increases to a sufficient level that able to press the device under test (4) against an upward thrust of the pogo pins (13) in a non-contact manner, resulting the device under test (4) contacts with the pogo pins (13). Heat is generated by the device under test (4) and circulated within said hollow housing (6) containing the compressed air. Temperature keeps increasing rapidly but at the same time said temperature is cooled or lowered down by the cooling medium circulated through the cooling passage (7) integrated in the wall of the hollow housing (6). A pre-set pressure valve (48) provided in the air outlet (10) is operatively connected to the processor (32) for controlling the release of said heat or hot air out of the hollow housing (6). Said pre-set pressure valve (48) is set at a pressure limit slightly below the incoming compressed air, thereby releasing a steady stream of hot air and lower the temperature of the hollow housing (6).

Figure 3:
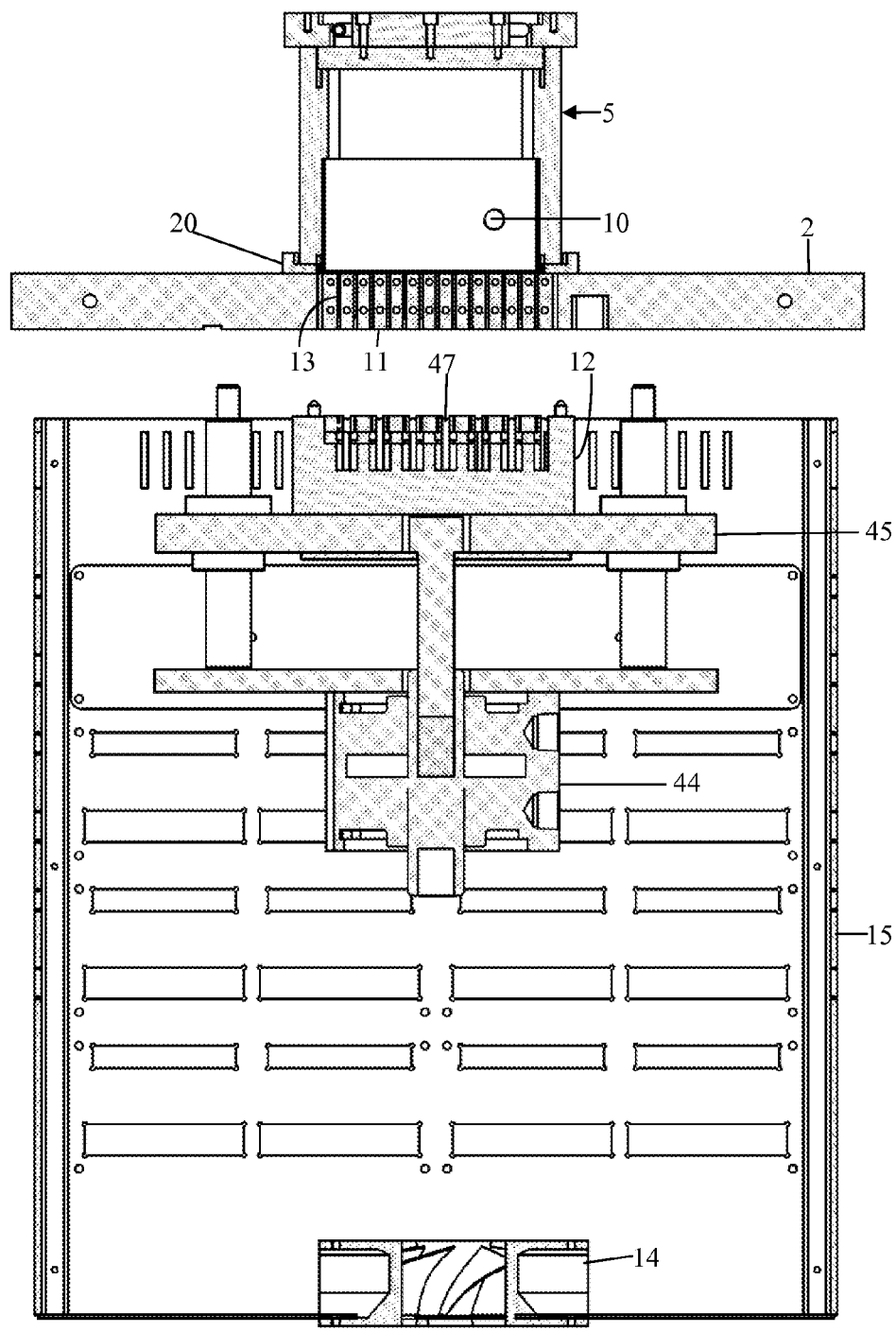
FIG. 3 is a cross-sectional view of the A-A portion of FIG. 2.
Figure 17:
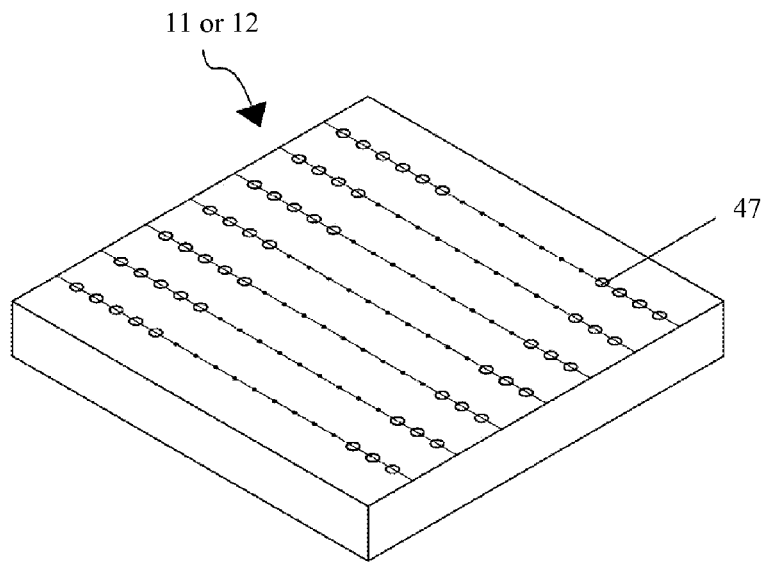
FIG. 17 is a perspective view of a pin guide means.

The upper guide (11) is embedded in the thermal conductive plate (2), whereas the lower guide (12) is positioned parallel and below the upper guide (11) as shown in FIG. 3. The upper guide (11) and lower guide (12), each has a plurality of high density guide holes (47) complementary with each other for loading the pogo pin (13) as illustrated in FIG. 17. Said upper (11) and lower (12) guides are preferably made from a ceramic material or an engineering plastic material including polyether-ether-ketone (PEEK). The guide holes (47) are drilled into the ceramic material very slowly. The pogo pin (13), preferably a plurality of pogo pins, is loaded in the upper guide (11). The upper (11) and lower (12) guides provide complete guide to position the pogo pin (13) precisely and to insulate electrical current to the device under test (4) and the thermal conductive plate (2). The pogo pin (13) is preferably connected to the electrical current supply via the wire jack (21) or any suitable connector. An actuator (44), preferably an air cylinder positioned below the lower guide (12) for controlling movement of the lower guide (12).

Conventionally, to burn-in the device under test, said device is usually loaded into a test socket on a load board, wherein said load board is a printed circuit board (PCB) that is used to hold and route signal traces for the entire device undergoing burn-in. In other words, the PCB acts as interconnection between pogo pin (13) and the electrical current supply for example a current driver. However, the PCB has limitation on ability to operate several thousands of high density of the pogo pin (13) under high electrical current. PCB is often made from FR4 or similar material that has very poor heat conductivity and operating temperature. This often results in excess heat and burnt load board (preferably the PCB), open and short traces. Therefore, in the preferred embodiment of the present invention, the upper guide (11), lower guide (12) and the wire jack (21) are utilised to replace the test socket load board for connecting the pogo pin (13) to the electrical driver instrument that supplies electrical current to the device under test (4) via the pogo pin (13). This construction enables the pogo pin (13) to be operated at high density and high current while allowing the circulation of the cooling medium in the cooling channel (3) to regulate or reduce temperature of the device under test (4) and said pogo pin (13).

Figure 19:
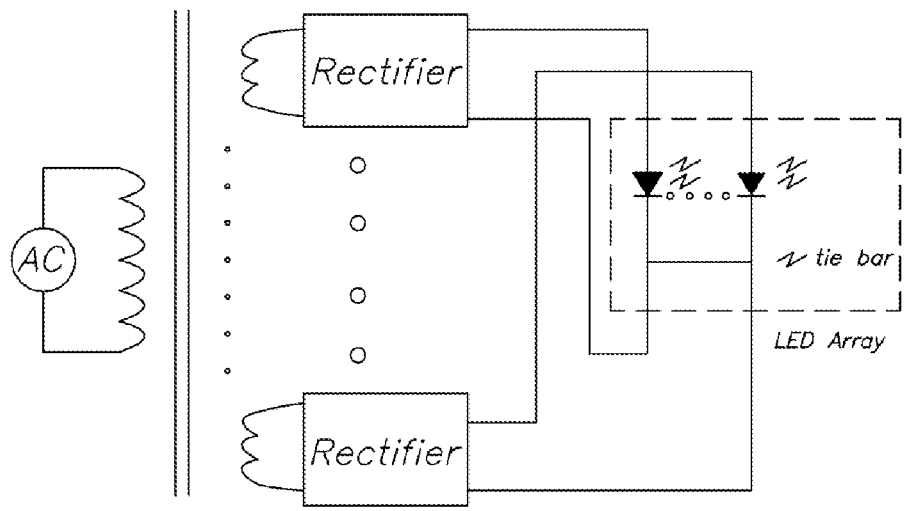
FIG. 19 is a schematic diagram showing electrical connection of the device under test with an electrical current supply.

For the device under test (4) especially the light emitting diode (LED) array, the construction invariably incorporates a tie-bar or a common ground, a common cathode or a common anode as a mean to simplify the LED manufacturing process and handling. This is often a source of current crowding leading to a burnt connection of other connected component such as the pogo pin (13), the wire jack (21) and the connector during the burn-in test. To overcome this problem, said apparatus provides the multi-channels, floating ground constant current driver for neutralizing the negative effect (current crowding and burnt connection) caused by the tie-bar without the need to remove the tie-bar. A schematic diagram showing electrical connection of the device under test (4) with the electrical current supply and tie-bar is illustrated in FIG. 19.

Figure 18:
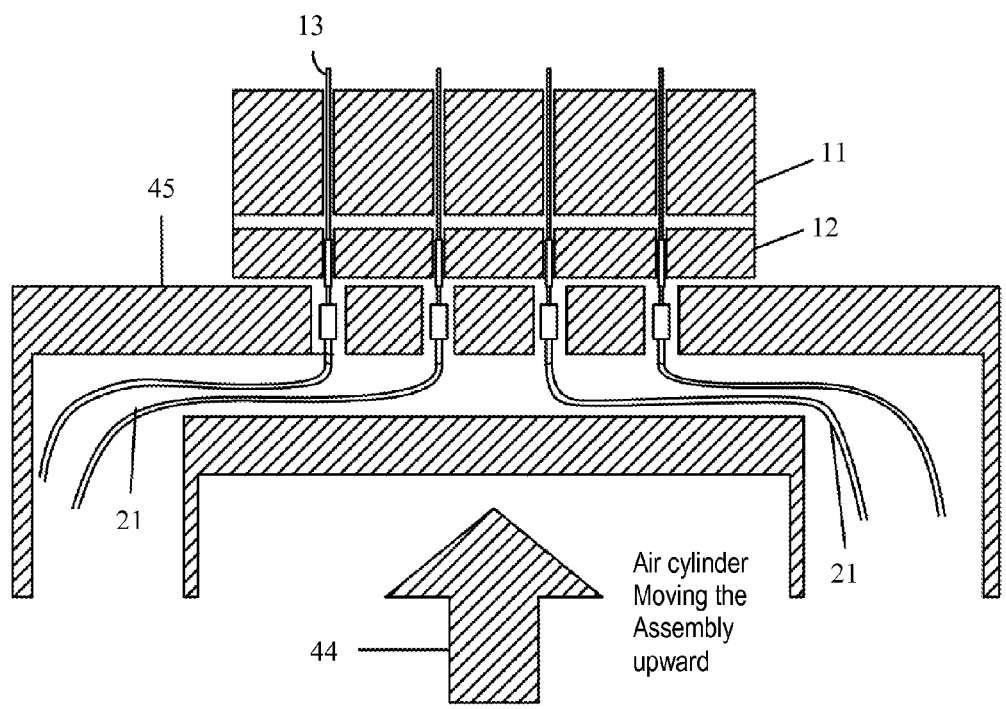
FIG. 18 is a cross-sectional view showing connection of a pogo pin with a wire jack during operation.

In operation, the device under test (4) is placed on the thermal conductive plate (2) without intimate contact with the surface of the thermal conductive plate (2). The compressed air supply is actuated causes the pressure chamber (5) to lower down engaging with the device under test (4). The locking means (22) moves downwards, causes the hollow housing (6) coupled tightly with the device under test (4). The compressed air is then supplied into the hollow housing (6) by the compressed air supply via the air inlet (8) while the seal (9) seals the hollow housing (6) tightly over the device under test (4). This configuration creates a pressure within the hollow housing (6), wherein said pressure is uniformly exerted to the surface of the device under test (4), thereby pressing said device under test (4) against the surface of the thermal conductive plate (2). At the same time, the lower guide (12) moves upwards, engaged with the upper guide (11), thereby bringing said pogo pin (13) in contact with the device under test (4). In a preferred embodiment of the present invention, said apparatus further equipped with a support (45) for holding the lower guide (12). The actuator (44) is particularly positioned below the support (45) and operatively connected with the processor (32) for controlling movement of said lower guide (12) as depicted in FIG. 18. Said pogo pin (13) is connected to the external electrical current supply via the wire jack (21) or any connector suitable to be used to transmit the electrical current. When the electrical current supply is actuated, the electrical signal is transmitted to the device under test (4) via the pogo pin (13) and power up said device under test (4). Heat and an elevated temperature are then generated over the device under test (4). The cooling medium flows through the cooling channel (3) for regulating the temperature or lower down the elevated temperature to the predetermined operation temperature.

Movement (upward movement) of the pogo pin (13) by the lower guide (12) is only activated after the compressed air inside the hollow housing (6) reaches a predetermined level. The pressure of the pressure chamber (5) is adjusted or calibrated corresponding to pressure of the device under test (4). The advantage of utilising the compressed air to hold down the device under test (4) (for example the LED and the semiconductor including an IC substrate) in the present invention is the exertion of the perfect even force onto the surface of the device under test (4). It provides an alternative option for holding down a device under test (4), which cannot be touched or held mechanically. Said hold down manner also creates an advantage of preventing a fragile device under test from undue mechanical stress as seen in a conventional hold and push method.

Figure 16:
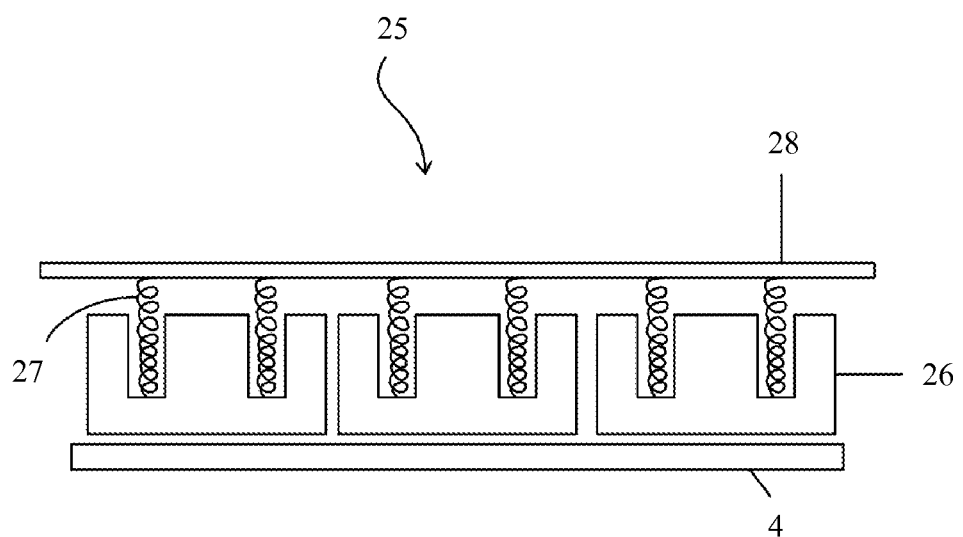
FIG. 16 is a cross-sectional view of a clamping means.

Referring to FIG. 16, said apparatus further employs the clamping means (25) for holding down the device under test (4) to exert constant pressure evenly across the surface of the device under test (4) and maintain an intimate contact with the pogo pin (13). Said clamping means (25) includes the clamp holder (26) having a plurality of openings for holding the spring (27); the cover plate (28) positioned above the clamp holder (26), is caused to press against the spring (27) resulting the clamp holder (26) moves downwardly towards the device under test (4) until said device under test (4) contacts with the pogo pin (13). The spring (27) is then decompressed returning to its original position. Said clamp holder (26) is preferably made from an engineering plastic material including the poly-ether-ether-ketone (PEEK), which will not cause any scratch on the surface of the device under test (4). In another preferred embodiment, said clamping means (25) can work without the utilisation of the pressure chamber (5).

Figure 20:
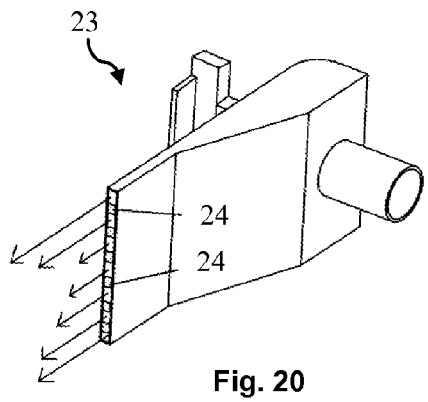
FIG. 20 is a perspective view of a multi-stream air nozzle.
Figure 21:
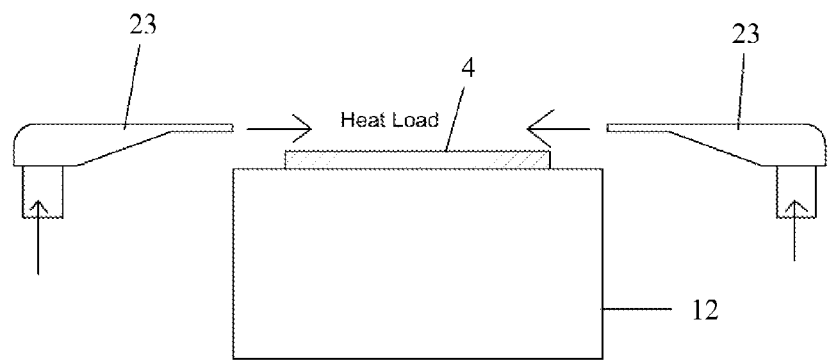
FIG. 21 is a side view of the multi-stream air nozzle at an operating position.

In another preferred embodiment of the present invention, said apparatus further comprises an air nozzle (23), preferably a multi-stream air nozzle (23) for providing a second cooling effect to said apparatus. As can be seen in FIG. 20 and FIG. 21, the air nozzle (23) is preferably placed above the device under test (4) and mounted on the enclosure (15), for cooling and regulating the temperature across the surface of the device under test (4). Said multi-stream air nozzle (23) is designed to cool the surface of the device under test (4) uniformly by carefully adjusting each air stream delivered to the device under test (4) surface. The air delivered by said air nozzle (23) is preferably a refrigerated air. At an air discharge hole of said air nozzle (23) includes a stopper (24) used to control the flow rate of the refrigerated air.

Although the present invention has been described with reference to specific embodiments, also shown in the appended figures, it will be apparent for those skilled in the art that many variations and modifications can be done within the scope of the invention as described in the specification and defined in the following claims.

Description of the reference numerals used in the accompanying drawings according to the present invention:

| Reference Numerals | Description |
| --- | --- |
| 2 | Thermal conductive plate |
| 3 | Cooling channel |
| 4 | Device under test |
| 5 | Pressure chamber mechanism |
| 6 | Hollow housing |
| 7 | Cooling passage |
| 8 | Air inlet |
| 9 | Seal |
| 10 | Air outlet |
| 11 | Upper guide |
| 12 | Lower guide |
| 13 | Pogo pin |
| 14 | Fan |
| 15 | Enclosure |
| 16 | Heater |
| 17 | Moisture barrier |
| 18 | Thermal matching material |
| 19 | Reservoir chiller |
| 19a | First reservoir |
| 19b | Second reservoir |
| 20 | Nested plate |
| 21 | Wire jack |
| 22 | Locking means |
| 23 | Air nozzle |
| 24 | Stopper |
| 25 | Clamping means |
| 26 | Clamp holder |
| 27 | Spring |
| 28 | Cover plate |
| 29 | Cooling medium pump |
| 29a | First pump |
| 29b | Second pump |
| 30 | Channel inlet |
| 31 | Channel outlet |
| 32 | Processor |
| 33 | Release valve |
| 34 | Temperature control valve |
| 35 | Thermal compound |

-continued

| Reference Numerals | Description |
| --- | --- |
| 36 | Teflon |
| 37 | Multiple temperature control zone |
| 38 | Slot |
| 39 | Body |
| 40 | Tube |
| 42 | Bracket |
| 43 | tube fitting |
| 44 | Actuator |
| 45 | Support for lower guide |
| 46 | Braze joint |
| 47 | Guide hole |
| 48 | Pressure valve |

I claim:

1. An apparatus for burn-in of a device under test (4), comprising:
a thermal conductive plate (2);
a device under test (4);
a pressure chamber (5);
a pin guide means;
a processor (32) operatively connected with said thermal conductive plate (2), the pressure chamber (5) and the pin guide means;
and characterized by:
the thermal conductive plate (2) including a cooling channel (3) for allowing passage of a cooling medium for regulating temperature of the thermal conductive plate (2);
the device under test (4) is placed on the thermal conductive plate (2);
the pressure chamber (5) engaged to the device under test (4), comprising a hollow housing (6) including a top closed-end, a bottom open-end and a cooling passage (7) integrated in a wall of said hollow housing (6) for allowing flow of the cooling medium to regulate temperature of said hollow housing (6); an air inlet (8) connected to an air supply for delivering compressed air into the hollow housing (6) to create a pressure within said hollow housing (6), wherein said pressure is uniformly exerted on a surface of the device under test (4) to press said device under test (4) against the thermal conductive plate (2), a seal (9) coupled to a periphery of the bottom open-end of the hollow housing (6) for sealing said hollow housing (6) over the device under test (4) to retain the compressed air within said hollow housing (6), and an air outlet (10) for releasing the compressed air from said hollow housing (6); and
a pin guide means comprising an upper guide (11) having a plurality of guide holes (47), embedded in the thermal conductive plate (2), a plurality of pogo pins loaded into the guide holes of the upper guide (11) and electrically connected to an electrical current supply; and a lower guide (12) having a plurality of guide holes (47), positioned parallel to and below the upper guide (11) for engaging with the upper guide (11) and elevating the pogo pins (13), thereby bringing said pogo pins (13) into contact with the device under test (4).

2. The apparatus for burn-in of a device under test (4) according to claim 1, wherein the device under test (4) comprises a semiconductor, a light emitting diode (LED), a semiconductor array, a light emitting diode (LED) array or a combination thereof.

3. The apparatus for burn-in of a device under test (4) according to claim 1, wherein said apparatus further comprises a fan (14) affixed below the lower guide (12) for circulating cold air to achieve a uniform temperature.

4. The apparatus for burn-in of a device under test (4) according to claim 1, wherein said apparatus further comprises an enclosure (15) for covering periphery of the lower guide (12).

5. The apparatus for burn-in of a device under test (4) according to claim 1, wherein the thermal conductive plate (2) is made from stainless steel, copper, aluminium, a thermal matching medium (18) or a combination thereof.

6. The apparatus for burn-in of a device under test (4) according to claim 5, wherein the thermal matching medium (18) is used for matching the temperature of said thermal conductive plate (2) to an operating temperature of the cooling medium.

7. The apparatus for burn-in of a device under test (4) according to claim 1, wherein the thermal conductive plate (2) includes a multiple temperature control zones (37); a plurality of slots (38) on a surface of said plate (2) for effectively isolating the multiple temperature control zones (37).

8. The apparatus for burn-in of a device under test (4) according to claim 1, wherein the cooling channel (3) is connected to a dual reservoir chiller (19).

9. The apparatus for burn-in of a device under test (4) according to claim 1, wherein the cooling channel (3) comprises a copper coil.

10. The apparatus for burn-in of a device under test (4) according to claim 1, wherein the thermal conductive plate (2) includes a heater (16) for providing heat to the thermal conductive plate (2).

11. The apparatus for burn-in of a device under test (4) according to claim 5, wherein the heater (16) includes a moisture barrier (17) for preventing moisture intrusion.

12. The apparatus for burn-in of a device under test (4) according to claim 5, wherein the heater (16) is bent downwards for preventing moisture seepage during heating.

13. The apparatus for burn-in of a device under test (4) according to claim 5, wherein the heater (16) is controlled by the processor (32) for providing a secondary temperature control.

14. The apparatus for burn-in of a device under test (4) according to claim 1, wherein said apparatus further comprises a nested plate (20) on the thermal conductive plate (2) for receiving the pressure chamber (5).

15. The apparatus for burn-in of a device under test (4) according to claim 1, wherein a temperature valve (34) is placed at the channel outlet (31) of the cooling channel (3) for ensuring the cooling medium completely fills the cooling channel (3).

16. The apparatus for burn-in of a device under test (4) according to claim 1, wherein said apparatus further comprises a locking means (22) for locking the pressure chamber (5) in place.

17. The apparatus for burn-in of a device under test (4) according to claim 1, wherein the pressure is uniformly exerted on the surface of the device under test (4) to press said device under test (4) against the thermal conductive plate (2) in a non-contact manner.

18. The apparatus for burn-in of a device under test (4) according to claim 1, wherein the pressure chamber (5) further comprises a pressure valve (48) for releasing hot air from interior of the hollow housing and aiding in cooling down temperature and pressure of the pressure chamber (5).

19. The apparatus for burn-in of a device under test (4) according to claim 1, wherein the device under test (4) is connected to a multi-channel, floating ground constant current driver for eliminating current crowding and preventing burn-out of components connected to the device under test (4).

20. The apparatus for burn-in of a device under test (4) according to claim 1, wherein the upper guide (11) and the lower guide (12) are each independently made from ceramic material or engineering plastic material.

21. The apparatus for burn-in of a device under test (4) according to claim 1, wherein said apparatus further comprises an air nozzle (23) for regulating and cooling the surface temperature of the device under test (4).

22. The apparatus for burn-in of a device under test (4) according to claim 1, wherein said apparatus further comprises a clamping means (25) comprising a clamp holder (26) for holding a spring (27); and a cover plate (28) positioned above the spring (27) for pressing on said spring (27), thereby contacting the clamp holder (26) with the device under test (4).

23. The apparatus for burn-in of a device under test (4) according to claim 1, wherein said cooling medium is water or a thermal oil.

* * * * *